United States Patent [19]
Chen et al.

[11] Patent Number: 5,639,342
[45] Date of Patent: Jun. 17, 1997

[54] METHOD OF MONITORING AND CONTROLLING A SILICON NITRIDE ETCH STEP

[75] Inventors: Sen Fu Chen, Taipei; Wen Cheng Chang, Tauyuan; Heng Hsin Liu; Bao Ru Yang, both of Hsin-Chu, all of Taiwan

[73] Assignee: Taiwan Semiconductor Manufacturing Company Ltd., Hsin-Chu, Taiwan

[21] Appl. No.: 616,416

[22] Filed: Mar. 15, 1996

[51] Int. Cl.⁶ ............................................. H01L 21/00
[52] U.S. Cl. ........................... 156/626.1; 156/653.1; 156/662.1; 216/84
[58] Field of Search ..................... 156/626.1, 646.1, 156/657.1; 437/8

[56] References Cited

U.S. PATENT DOCUMENTS

| | | | |
|---|---|---|---|
| 4,316,765 | 2/1982 | Thiel | 156/626 |
| 4,484,979 | 11/1984 | Stocker | 156/643 |
| 4,820,378 | 4/1989 | Loewenstein | 156/643 |
| 5,362,356 | 11/1994 | Schoenborn | 156/626 |
| 5,387,316 | 2/1995 | Pennell et al. | 156/647 |
| 5,460,034 | 10/1995 | Herrick | 73/105 |

*Primary Examiner*—R. Bruce Breneman
*Assistant Examiner*—Michael E. Adjodha
*Attorney, Agent, or Firm*—George O. Saile; Larry J. Prescott

[57] ABSTRACT

A patterned silicon nitride layer formed over a semiconductor integrated circuit wafer having a layer of pad oxide is often used as a mask for subsequent processing steps. Etching of the silicon nitride layer is difficult to control and can create defects in the pad oxide layer which are difficult to detect before the manufacture of the semiconductor integrated circuit wafer is completed. A method is described using potassium hydroxide treatment and scanning electron microscope evaluation of a test wafer for detection of defects at the silicon nitride etching step. Continued processing of defective wafers can be terminated and the silicon nitride etching step can be controlled using this method.

22 Claims, 3 Drawing Sheets

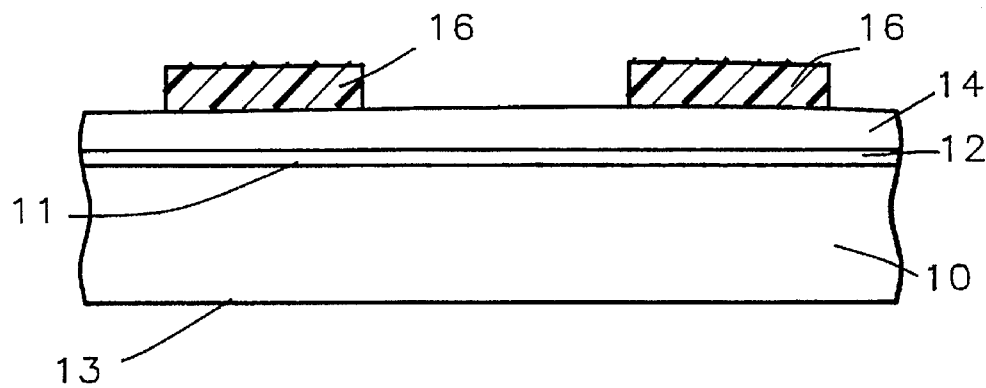
FIG. 1A – Prior Art
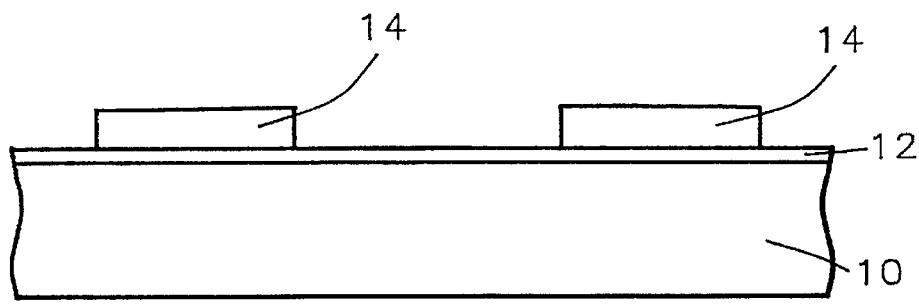
FIG. 1B – Prior Art
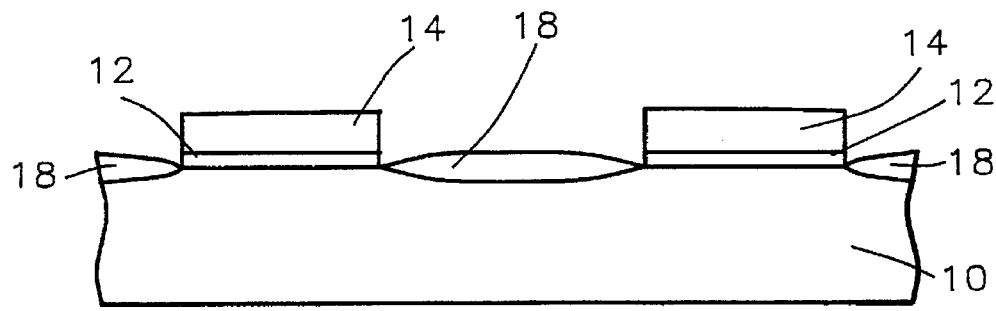
FIG. 1C – Prior Art

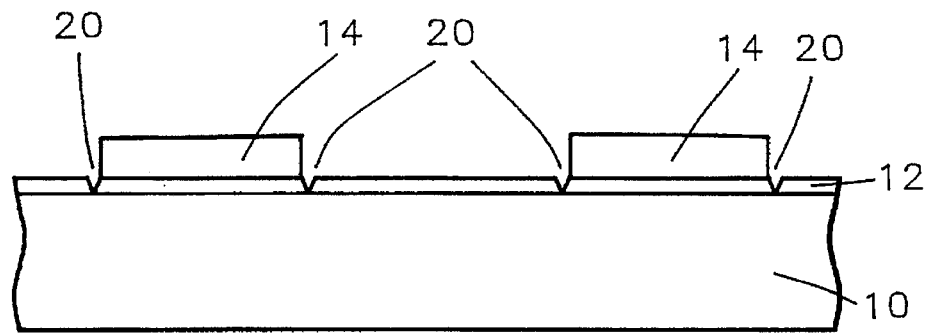
FIG. 1D - Prior Art
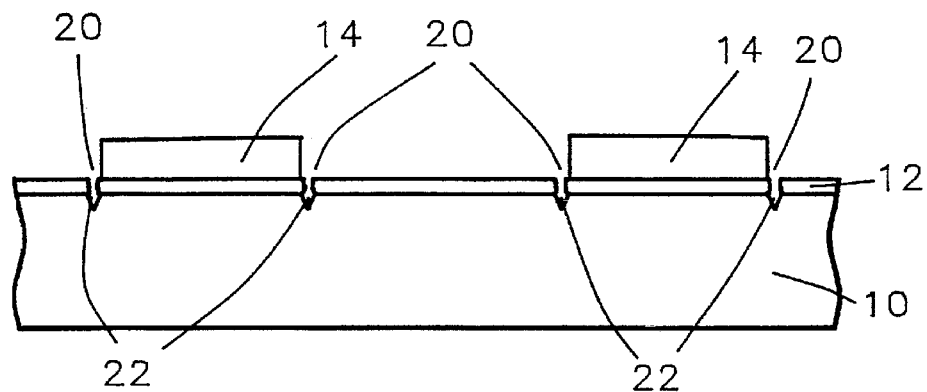
FIG. 2
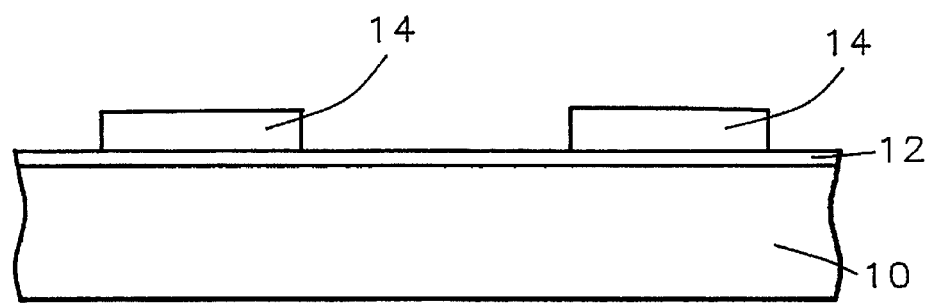
FIG. 3

1

METHOD OF MONITORING AND CONTROLLING A SILICON NITRIDE ETCH STEP

BACKGROUND OF THE INVENTION

(1) Field of the Invention

This invention relates to a method of detecting defects caused by a silicon nitride etching step in order to stop processing defective wafers and control the silicon nitride etching step. More particularly the invention relates to the use of a scanning electron microscope evaluation of test wafers treated with potassium hydroxide after the test wafers have passed through the silicon nitride etching step.

(2) Description of the Related Art

A patterned layer of silicon nitride formed over a layer of pad oxide is often used as a mask in the manufacture of semiconductor integrated circuit wafers. The pattern is formed in the silicon nitride layer using dry etching and control of this etching step is both important and difficult. This invention provides a method of detecting defects due to the silicon nitride etching step using a potassium nitride treatment and scanning electron microscope evaluation of a test wafer. This early detection of defects provides a means to control the silicon nitride etching step.

U.S. Pat. No. 5,362,356 to Schoenborn describes methods for monitoring film removal during plasma etching. Silicon nitride is one of the materials that can be monitored using the methods described by Schoenborn. The control methods described by Schoenborn are different from the method described in this patent application which uses a test wafer for monitoring a lot of N wafers.

SUMMARY OF THE INVENTION

In processing semiconductor integrated circuit wafers the use of a silicon nitride, $Si_3N_4$, masking layer formed on a layer of pad oxide is often used for processes such as the formation of a field oxide region for device isolation. A pattern is etched in the silicon nitride masking layer using dry etching and a photoresist mask. As design ground rules call for tighter tolerances it is desirable to use a thinner pad oxide. The thinner pad oxide increases the possibility of forming defects in the pad oxide during silicon nitride etching.

Control of the silicon nitride etching step becomes more critical as the pad oxide becomes thinner. If the control of the etching step is not correct defects can be formed in the pad oxide and in the integrated circuit wafer which are difficult to detect but which will cause junction leakage and yield loss in the completed wafer. These defects occur early in the process sequence but they will cause problems which will only be detected near the end of the process sequence and result in wasting both process time and capability on defective wafers.

The problem encountered in conventional processing of integrated circuit wafers during the formation of the field oxide isolation region is shown in FIGS. 1A–1D. As shown in FIG. 1A a layer of pad oxide 12 is formed on a semiconductor integrated circuit wafer 10. A layer of silicon nitride, $Si_3N_4$, 14 is formed on the layer of pad oxide 12. A first pattern formed in a layer of photoresist 16 is formed on the layer of silicon nitride. As shown in FIG. 1B the first pattern is then formed in the layer of silicon nitride 14 using dry etching and the first pattern in the layer of photoresist as a mask. The photoresist is then removed. As shown in FIG. 1C the field oxide regions 18 are formed using the first

2 pattern in the layer of silicon nitride as a mask. If the etching of the layer of silicon nitride is not carried out correctly however defects 20 can be formed as shown in FIG. 1D. These defects are difficult to detect as this stage of the integrated circuit wafer manufacture but will cause junction leakage and yield problems after the manufacture of the wafer is completed.

It is a principle object of this invention to provide a method of detecting defects caused by etching the layer of silicon nitride, $Si_3N_4$, immediately after the etching of the layer of silicon nitride has been completed so that when defects are detected further wafer processing will be avoided and the process step for etching the layer of silicon nitride can be corrected immediately.

This objective is achieved by selecting a test wafer after the processing of a number of production wafers after the step of etching the layer of silicon nitride has been completed. The photoresist is removed from the test wafer and the surface of the test wafer is treated with potassium hydroxide, KOH. If defects are present the KOH treatment will cause triangular trenches to form at the location of the defects which can be detected by scanning electron microscope evaluation of the test wafer. If the triangular trenches are detected in the test wafer the process step for etching the layer of silicon nitride is corrected and the wafers etched between the test wafer showing trenches and the previous test wafer are scrapped. If no trenches are detected in the test wafer the processing of the production wafers proceeds normally.

BRIEF DESCRIPTION OF THE DRAWINGS

FIG. 1A shows a cross section view of a semiconductor wafer having a layer of pad oxide, a layer of silicon nitride, and a first pattern formed in a layer of photoresist.

FIG. 1B shows a cross section view of a semiconductor wafer having a layer of pad oxide and the first pattern formed in the layer of silicon nitride by etching without the formation of defects.

FIG. 1C shows a cross section view of a semiconductor wafer having field oxide isolation regions formed using the first pattern formed in the layer of silicon nitride as a mask.

FIG. 1D shows a cross section view of a semiconductor wafer having a layer of pad oxide and the first pattern formed in the layer of silicon nitride by etching with defects formed during the etching of the silicon nitride.

FIG. 2 shows a cross section view of a semiconductor wafer with defects formed during the etching of the silicon nitride and triangular trenches formed by treating the wafer with potassium hydroxide.

FIG. 3 shows a cross section view of a semiconductor wafer with no defects formed during the etching of the silicon nitride so that no triangular trenches are formed by treating the wafer with potassium hydroxide.

DESCRIPTION OF THE PREFERRED EMBODIMENTS

Figure 4:
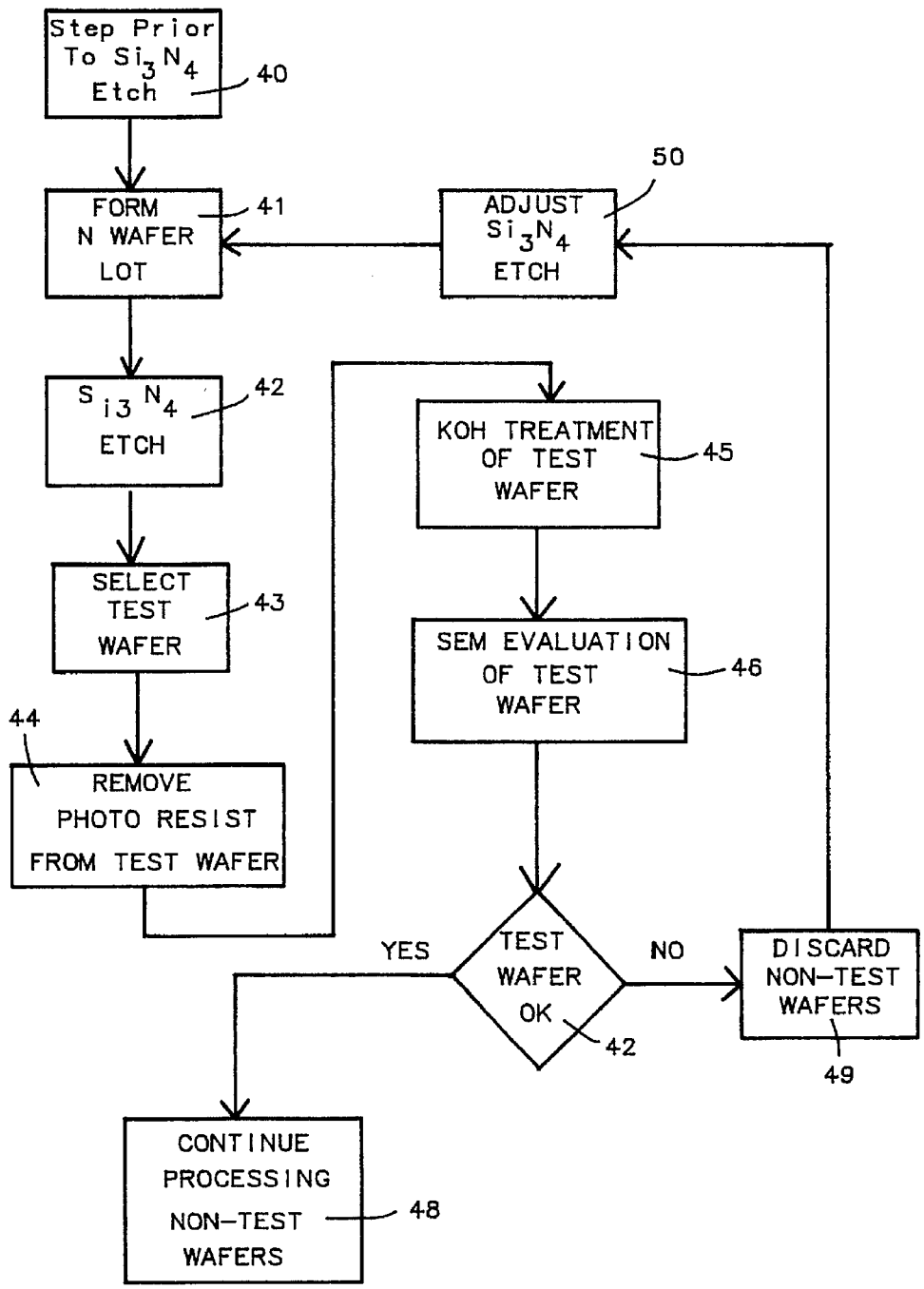
FIG. 4 shows a process flow diagram for the method of this invention for controlling defects formed during etching the layer of silicon nitride.

Refer now to FIGS. 1A, 1C, 2, 3, and 4, there is shown the embodiment of the method of controlling the silicon nitride, $Si_3N_4$, etching step of this invention. FIG. 1A shows a semiconductor integrated circuit wafer 10, having a first surface 11 and a second surface 13, with a layer of pad oxide 12 formed on the first surface 11 of the semiconductor wafer 10. As the design ground rules call for more precise tolerances the use of a thinner pad oxide is needed. In this embodiment the pad oxide is silicon dioxide having a thickness of between about 100 and 250 Angstroms. A layer of silicon nitride 14, $Si_3N_4$, having a thickness of between about 1000 and 1500 Angstroms is formed on the pad oxide layer 12 using chemical vapor deposition, CVD. A first pattern is formed in a layer of photoresist 16 on the layer of silicon nitride 14.

In this embodiment the silicon nitride is to be used as a mask for the formation of a field oxide isolation region 18, see FIG. 1C, however the method of the invention can be used wherever detecting defects formed by etching a silicon nitride layer formed over an oxide layer is desired. Next the first pattern is formed in the silicon nitride layer 14 using dry etching with $SF_6$ as an etchant and the first pattern formed in the photoresist layer as a mask. As shown in FIGS. 2 and 3 the photoresist is then removed leaving the first pattern formed in the layer of silicon nitride 14. As shown in FIG. 2, the silicon nitride etching step can cause defects 20 in the pad oxide layer 12 and extending to the first surface of the semiconductor wafer 10 if the silicon nitride etching step is not correct. As shown in FIG. 3, if the silicon nitride etching step is correct the first pattern is formed in the silicon nitride layer 14 without the formation of defects. These defects 20, see FIG. 2, can not be readily detected at this stage of the integrated circuit wafer manufacture.

In this embodiment a test wafer is selected after the first pattern has been etched in the silicon nitride layer. The first surface of the test wafer is then treated with potassium hydroxide, KOH, by immersing the first surface of the test wafer is a solution of KOH and water, which is between about 10% and 15% KOH by volume, having a temperature of between about 60° C. and 80° C. for between about 60 and 90 seconds. As shown in FIG. 2, if the etching of the silicon nitride has caused defects 20 in the pad oxide layer 12 the KOH treatment will form triangular trenches 22 in the first surface of the semiconductor wafer 10 at the location of the defects 20. The triangular trenches 22 formed by the KOH treatment can be readily detected by a scanning electron microscope, SEM, evaluation of the first surface of the semiconductor wafer using a magnification of between about 10,000 and 100,000. As shown in FIG. 3, if the etching of the silicon nitride does not cause defects in the pad oxide layer 12 the pad oxide layer 12 will protect the first surface of the semiconductor wafer 10 during the KOH treatment and no trenches will be formed in the first surface of the semiconductor wafer 10. In this manner the KOH treatment of a test wafer can detect if the etching of the silicon nitride layer is in proper control before additional processing of the wafers.

FIG. 4 shows a flow diagram of the method for using KOH treatment and SEM evaluation of the first surface of the semiconductor wafer to detect whether or not the etching of the silicon nitride layer has caused defects in the pad oxide. As shown by the flow diagram in FIG. 4, a wafer lot of N wafers, where N is a positive number, is formed 41 after the process step 40 immediately preceding the silicon nitride etch 42. One test wafer will be selected from the lot of N wafers. In this embodiment N is between about 250 and 500. The N wafers are then processed through the step of etching the silicon nitride layer 42. The N wafers are then separated into one test wafer 43 and N-1 non-test or production wafers.

The photoresist is then removed from the test wafer 44 and the N-1 production wafers are held either before or after removing the photoresist from the production wafers. The first surface of the test wafer is then treated with KOH 45 and evaluated using a scanning electron microscope 46, as previously described. If the SEM evaluation of the test wafer indicates that no trenches have been formed in the test wafer 47 the processing of the N-1 production, or non-test, wafers continues 48 according to the normal process flow. If, however, the SEM evaluation of the test wafer 48 indicates that trenches have been formed in the test wafer there is a high probability that a significant percentage of the N-1 production wafers have defects formed during the silicon nitride etching step. The N-1 production, or non-test, wafers are then discarded or scrapped 49 and the silicon nitride etching step is adjusted 50. The adjustment of the silicon nitride etching step 50 comprises adjusting the sensitivity of $Si_3N_4$ etching versus $SiO_2$ etching. The correctness of the silicon nitride etching step is verified using test wafers before normal processing is resumed.

This method provides a means to detect defects caused by the silicon nitride etching step at the point of the process where the defects are formed. This allows the number of wafers in which defects are formed to be minimized and prevents the further processing of defective wafers.

While the invention has been particularly shown and described with reference to the preferred embodiments thereof, it will be understood by those skilled in the art that various changes in form and details may be made without departing from the spirit and scope of the invention.

What is claimed is:

1. A method of in-process damage detection, comprising the steps of:

providing N semiconductor wafers each said semiconductor wafer having a first surface and a second surface wherein N is a positive number;

forming a layer of pad oxide on said first surface of each of said semiconductor wafers;

forming a layer of silicon nitride on each said layer of pad oxide;

forming a layer of photoresist on each said layer of silicon nitride;

forming a first pattern in each said layer of photoresist;

etching said first pattern in each said layer of silicon nitride using said first pattern in each said layer of photoresist as a mask;

selecting one wafer from said N semiconductor wafers to be a test wafer thereby separating said N semiconductor wafers into one said test wafer and N-1 production wafers;

removing the remaining part of said layer of photoresist from said N semiconductor wafers after etching said first pattern in each said layer of silicon nitride;

treating said first surface of said test wafer with a solution of potassium hydroxide after removing the remaining part of said layer of photoresist from said test wafer;

determining the presence or absence of defect trenches in said first surface of said test wafer after treating said first surface of said test wafer with said solution of potassium hydroxide;

continuing the processing of said N-1 production wafers after removing the remaining part of said layer of photoresist from said N-1 production wafers if said determining the presence or absence of defect trenches in said first surface of said test wafer indicates the absence of said defect trenches in said first surface of said test wafer; and terminating the processing of said N-1 production wafers after removing the remaining part of said layer of photoresist from said N-1 production wafers and adjusting the step of etching said first pattern in each said layer of silicon nitride if said determining the presence or absence of defect trenches in said first surface of said test wafer indicates the presence of said defect trenches in said first surface of said test wafer.

2. The method of claim 1 wherein said positive number N is between about 250 and 500.

3. The method of claim 1 wherein said treating said first surface of said test wafer with a solution of potassium hydroxide comprises immersing said first surface of said test wafer in a solution of potassium hydroxide and water wherein said volume of said potassium hydroxide in said solution of potassium hydroxide and water is between about 10% and 15%.

4. The method of claim 3 wherein said solution of potassium hydroxide and water has a temperature of between about 60° C. and 80° C.

5. The method of claim 1 wherein said determining the presence or absence of defect trenches in said first surface of said test wafer comprises a scanning electron microscope evaluation of said first surface of said test wafer.

6. The method of claim 5 wherein said scanning electron microscope evaluation of said first surface of said test wafer uses a magnification of between about 10,000 and 100,000.

7. The method of claim 1 wherein processing of said N-1 production wafers after said removing said remaining part of said layer of photoresist from said N-1 production wafers does not occur until said presence or absence of said defect trenches in said first surface of said test wafer has been determined.

8. The method of claim 1 wherein said layer of pad oxide is a layer of silicon dioxide having a thickness of between about 100 and 250 Angstroms.

9. The method of claim 1 wherein said layer of silicon nitride has a thickness of between about 1000 and 1500 Angstroms.

10. The method of claim 1 wherein said etching said first pattern in each said layer of silicon nitride uses dry etching with an etchant of $SF_6$.

11. The method of claim 1 wherein said adjusting the step of etching said first pattern in each said layer of silicon nitride comprises adjusting the etching rate of silicon nitride compared to the etching rate of silicon dioxide.

12. A method of in-process damage detection, comprising the steps of:

providing N semiconductor wafers each said semiconductor wafer having a first surface and a second surface wherein N is a positive number;

forming a layer of pad oxide on said first surface of each of said semiconductor wafers;

forming a layer of silicon nitride on each said layer of pad oxide;

forming a layer of photoresist on each said layer of silicon nitride;

forming a first pattern in each said layer of photoresist;

etching said first pattern in each said layer of silicon nitride using said first pattern in each said layer of photoresist as a mask;

selecting one wafer from said N semiconductor wafers to be a test wafer thereby separating said N semiconductor wafers into one said test wafer and N-1 production wafers;

removing the remaining part of said layer of photoresist from said test wafer after etching said first pattern in each said layer of silicon nitride;

treating said first surface of said test wafer with a solution of potassium hydroxide after removing the remaining part of said layer of photoresist from said test wafer;

determining the presence or absence of defect trenches in said first surface of said test wafer after treating said first surface of said test wafer with said solution of potassium hydroxide;

continuing the processing of said N-1 production wafers after etching said first pattern in each said layer of silicon nitride if said determining the presence or absence of defect trenches in said first surface of said test wafer indicates the absence of said defect trenches in said first surface of said test wafer; and terminating the processing of said N-1 production wafers after etching said first pattern in each said layer of silicon nitride and adjusting the step of etching said first pattern in each said layer of silicon nitride if said determining the presence or absence of defect trenches in said first surface of said test wafer indicates the presence of said defect trenches in said first surface of said test wafer.

13. The method of claim 12 wherein said positive number N is between about 250 and 500.

14. The method of claim 12 wherein said treating said first surface of said test wafer with a solution of potassium hydroxide comprises immersing said first surface of said test wafer in a solution of potassium hydroxide and water wherein said volume of said potassium hydroxide in said solution of potassium hydroxide and water is between about 10% and 15%.

15. The method of claim 14 wherein said solution of potassium hydroxide and water has a temperature of between about 60° C. and 80° C.

16. The method of claim 12 wherein said determining the presence or absence of defect trenches in said first surface of said test wafer comprises a scanning electron microscope evaluation of said first surface of said test wafer.

17. The method of claim 16 wherein said scanning electron microscope evaluation of said first surface of said test wafer uses a magnification of between about 10,000 and 100,000.

18. The method of claim 12 wherein processing of said N-1 production wafers after said removing said remaining part of said layer of photoresist from said N-1 production wafers does not occur until said presence or absence of said defect trenches in said first surface of said test wafer has been determined.

19. The method of claim 12 wherein said layer of pad oxide is a layer of silicon dioxide having a thickness of between about 100 and 250 Angstroms.

20. The method of claim 12 wherein said layer of silicon nitride has a thickness of between about 1000 and 1500 Angstroms.

21. The method of claim 12 wherein said etching said first pattern in each said layer of silicon nitride uses dry etching with an etchant of $SF_6$.

22. The method of claim 12 wherein said adjusting the step of etching said first pattern in each said layer of silicon nitride comprises adjusting the etching rate of silicon nitride compared to the etching rate of silicon dioxide.

* * * * *